(12) United States Patent
Norimatsu et al.

(10) Patent No.: US 11,545,592 B2
(45) Date of Patent: Jan. 3, 2023

(54) PHOTOSENSOR DEVICE AND METHOD OF MANUFACTURING A PHOTOSENSOR DEVICE

(71) Applicant: FUJITSU LIMITED, Kawasaki (JP)

(72) Inventors: Masaaki Norimatsu, Atsugi (JP); Daiyu Kondo, Atsugi (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 17/516,744

(22) Filed: Nov. 2, 2021

(65) Prior Publication Data

US 2022/0216360 A1 Jul. 7, 2022

(30) Foreign Application Priority Data

Jan. 7, 2021 (JP) .............. JP2021-001497

(51) Int. Cl.
*H01L 31/112* (2006.01)
*H01L 31/028* (2006.01)
*H01L 31/18* (2006.01)
*H01L 31/0216* (2014.01)
*H01L 31/0352* (2006.01)

(52) U.S. Cl.
CPC ........ *H01L 31/1129* (2013.01); *H01L 31/028* (2013.01); *H01L 31/02161* (2013.01); *H01L 31/035281* (2013.01); *H01L 31/1804* (2013.01); *H01L 31/1868* (2013.01)

(58) Field of Classification Search
CPC ........... H01L 31/1129; H01L 31/02161; H01L 31/028; H01L 31/1804; H01L 31/1868; H01L 31/02327; H01L 31/035281; Y02P 70/50
See application file for complete search history.

(56) References Cited

U.S. PATENT DOCUMENTS

| 2013/0273261 | A1 | 10/2013 | Gardner et al. |
| 2018/0106933 | A1* | 4/2018 | Chanda .............. H01L 31/09 |
| 2019/0229223 | A1* | 7/2019 | Chanda .............. H01L 31/09 |
| 2020/0152679 | A1* | 5/2020 | Sato .................. B82Y 10/00 |
| 2020/0152817 | A1* | 5/2020 | Sato .................. H01L 31/0224 |
| 2021/0297788 | A1* | 9/2021 | Chou ................ H04R 19/04 |
| 2022/0216360 | A1* | 7/2022 | Norimatsu ........ H01L 31/1868 |

FOREIGN PATENT DOCUMENTS

| JP | 2014-535124 A | 12/2014 |
| JP | 2017-130669 A | 7/2017 |

OTHER PUBLICATIONS

Alireza Safaei et al., "Dirac Plasmon-assisted Asymmetric Hot Carrier Generation for Room-temperature Infrared Detection", Nature Communications, (2019)10; 3498, pp. 1-7 (Total 7 pages).

* cited by examiner

*Primary Examiner* — Earl N Taylor
(74) *Attorney, Agent, or Firm* — Fujitsu Patent Center (57) ABSTRACT

A photosensor device includes a substrate, a graphene layer provided on the substrate, a pair of electrodes electrically connected to the graphene layer, and a passivation layer formed of a resin and configured to cover the graphene layer. The graphene layer has holes which are periodically arranged, and the passivation layer is provided with openings that communicate with the holes. The side surfaces of the holes and the inner walls of the openings are continuously covered with an insulating thin film.

8 Claims, 10 Drawing Sheets

PHOTOSENSOR DEVICE AND METHOD OF MANUFACTURING A PHOTOSENSOR DEVICE

CROSS-REFERENCE TO RELATED APPLICATIONS

This application is based upon and claims priority to earlier Japanese Patent Application No. 2021-001497 filed Jan. 7, 2021, which is incorporated herein by reference in its entirety.

FIELD

The disclosure relates to a photosensor device and a method of manufacturing a photosensor device.

BACKGROUND

Infrared sensors detect infrared rays radiated from objects with thermal energies, and are applied to automatic doors, security camera systems, inspections of infrastructure, etc. As a quantum infrared sensor which generates electric charges proportional to the intensity of incident light, compound semiconductor infrared sensors nave been developed and commercially manufactured. Sensitivity with respect to a desired wavelength band can be imparted to a quantum sensor, by controlling the combination and/or composition of materials, film thickness, and so on. Quantum infrared sensors are generally operated at cryogenic temperatures of 60K to 100K to suppress the influence of thermal noise, and a cooling system is required.

A thermal infrared detector, which detects a resistance change making use of a temperature change due to heat induced when receiving infrared rays, can be used at room temperature; however, its sensitivity is unsatisfactory compared with that of a quantum infrared sensor. A graphene infrared detector operable based on plasmon-induced hot carrier generation is proposed (see, for example, Non-Patent Document 1).

The wavelength range of infrared light is very broad, and there is a demand for a highly sensitive photosensor with wideband responsivity, operable at room temperature.

Prior art document(s) known to the inventors is (are) as follows:
Patent Document 1: JP Patent Application Laid-open Publication No. 2017-130669, and
Non-Patent Doc. 1: Alireza Safaei, et al., 'Dirac plasmon-assisted asymmetric hot carrier generation for room-temperature infrared detection', Nat. Comm., 10, 3498 (2019)

SUMMARY

In an embodiment, a photosensor device has a substrate, a graphene layer provided on the substrate, a pair of electrodes electrically connected to the graphene layer, and a passivation layer formed of a resin and configured to cover the graphene layer, wherein the graphene layer has holes which are periodically arranged, and the passivation layer is provided with openings that communicate with the holes. The side surfaces of the holes and the inner walls of the openings are continuously covered with an insulating thin film.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

EMBODIMENT(S)

In an embodiment, graphene is used as a light receiving layer to achieve infrared detection in a wide wavelength range. Graphene is a two-dimensional material having high mobility, in which carbon atoms form a two-dimensional honeycomb structure, and is capable of absorbing light over a wide wavelength range. This is because of the unique energy band structure of graphene. One problem arising from a graphene photosensor is a change in electrical characteristics due to the environmental change. The Dirac point, at which the drain current with respect to the gate voltage becomes the minimum, fluctuates due to the moisture on the device surface. Another problem is that graphene may be excessively removed during micro-processing or etching, which may cause peeling off and moisture penetration and result in deterioration of sensor characteristics. In the embodiment, these problems are solved by the structure and the method described below, and a photosensor with a high sensitivity and wideband responsivity, operable in a stable manner, is provided.

The conduction band and valence band of graphene can be described by point-symmetric cone-like band structure, around the Dirac point (K point or K' point in the wave number or reciprocal space). Because the conduction band and the valence band intersect at the Dirac point and do not have a band gap, light can be absorbed over a wide wavelength range. Three of the four electrons of the graphene carbon atom are bonded to adjacent atoms. The fourth electron is in an orbit extending vertically from the graphene plane, and it can move as a free electron at a high speed within the graphene plane.

Figure 1:
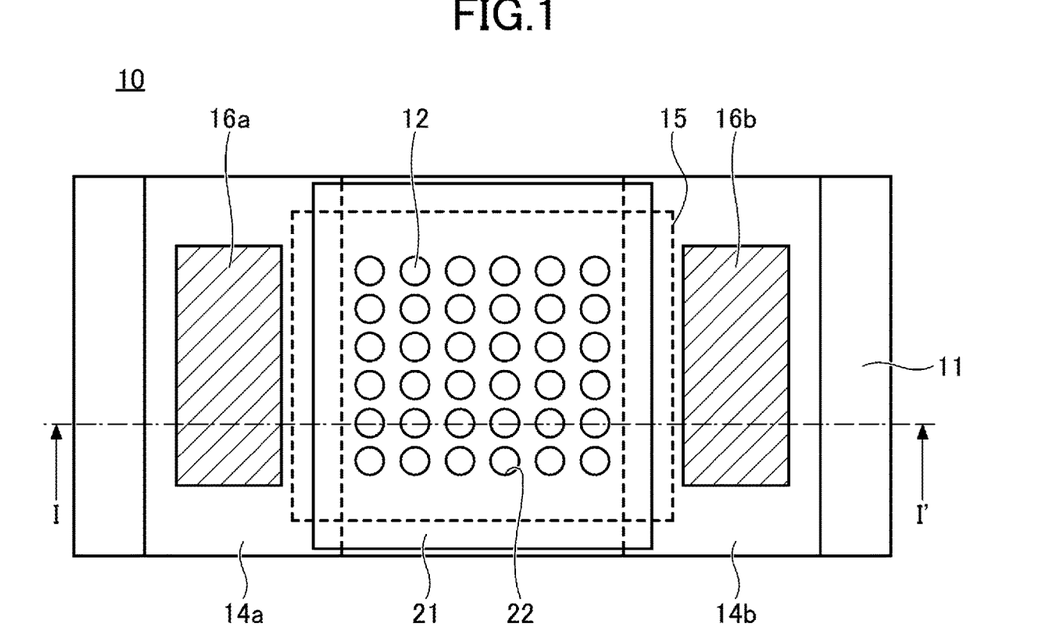
FIG. 1 is a schematic plan view of a photosensor device according to an embodiment.
Figure 2:
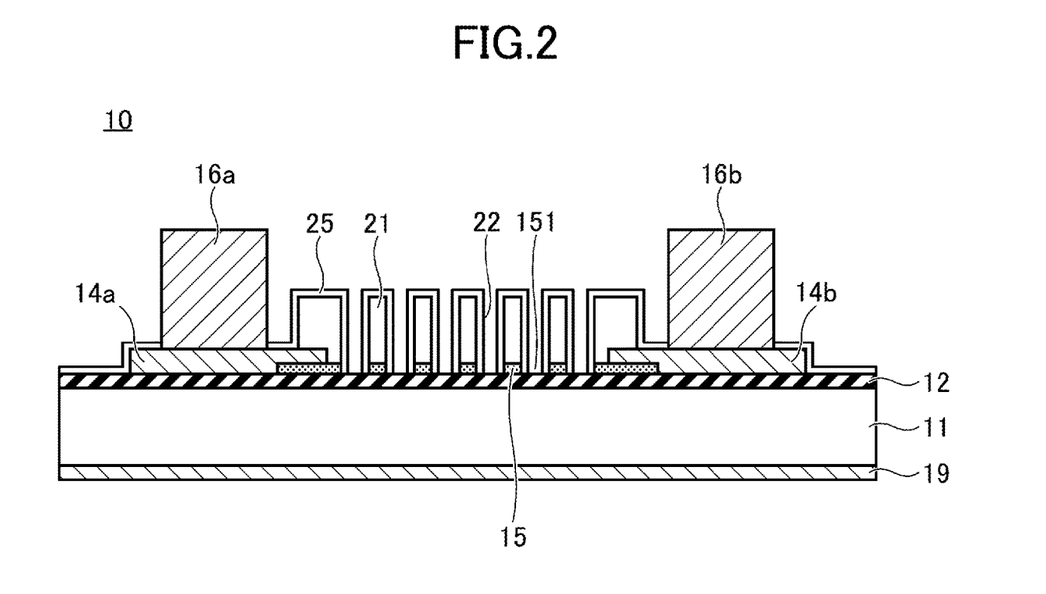
FIG. 2 is a schematic cross-sectional view taken along the I-I' line of FIG. 1.

FIG. 1 is a schematic plan view of a photosensor device 10 according to an embodiment, and FIG. 2 is a schematic cross-sectional view taken along the I-I' line of FIG. 1. In the photosensor device 10, a graphene layer 15 having periodically arranged holes 151 is provided on an insulating film 12 formed on a substrate 11. When a silicon substrate is used as the substrate 11, the insulating film 12 may be a thermal oxide film, or it may be another type of insulating film such as a silicon nitride film or an aluminum oxide film.

By providing the holes 151 in the graphene layer 15, the light absorption of the photosensor device 10 can be enhanced upon incidence of light. The incident light excites plasmons, that is, collective vibrations of free electrons on the surface of the graphene layer 15. In the vicinity of the edges of the holes 151, the light is strongly confined to the oscillating electric field, and the light absorption is promoted, compared with a graphene film without holes 151. Consequently, the detection sensitivity to the incident light is improved. The holes 151 may not completely penetrate through the graphene layer 15, or do not have to reach the insulating film 12.

A pair of electrodes 14a and 14b are provided at both ends of the graphene layer 15 so as to overlap the graphene layer 15. One of the electrodes 14a and 14b may serve as a source electrode, and the other may be a drain electrode. The electrode pads 16a and 16b are connected to the electrodes 14a and 14b, respectively, and the current flowing through the graphene layer 15 can be externally detected. A gate electrode 19 is provided on the back surface of the substrate 11, on the side opposite the electrodes 14a and 14b, to form a back gate type transistor structure.

The surface of the graphene layer 15 is covered with a passivation layer 21. Openings 22 are formed in the passivation layer 21, which are also periodically arranged corresponding to the holes 151 of the graphene layer 15. The openings 22 of the passivation layer 21 communicate with the holes 151 of the graphene layer 15. The surface of the passivation layer 21, the inner walls of the openings 22, and the side surfaces of the holes 151 of the graphene layer 15 are continuously covered with a thin film 25 formed by an ALD process. With the ALD process, the film thickness can be precisely controlled at the atomic layer level, and a thin and dense film can be formed. Hereinafter, the thin film 25 will be referred to as an "ALD layer 25" named after the film forming method.

The ALD layer 25 fills the gaps between the graphene layer 15 and the passivation layer 21, and improves the weather resistance of the device. Weather resistance generally refers to the ability of a material to withstand the outdoor environment and the changes thereof. In the case of the photosensor device 10, the weather resistance includes the property of suppressing the fluctuation of the Dirac point even if the environment in which the photosensor device 10 is placed has changed.

The passivation layer 21 is also used to enhance the weather resistance. A resist mask for forming holes 151 in the graphene layer 15 may be used as the passivation layer 21; however, in such a case, a gap may be produced between the graphene layer 15 and the passivation layer 21 due to the hydrophobic nature of the graphene layer 15. The gap may cause peeling off and moisture penetration, and affect the sensor characteristics. By covering the side surface of the holes 151 of the graphene layer 15 and the inner walls of the openings 22 of the passivation 21 with the ALD layer 25, peeling off and moisture penetration can be prevented. As a result, the fluctuation of the Dirac point can be suppressed to a negligible level, as will be described in more detail later.

During operation, a constant bias voltage is applied between the electrodes 14a and 14b, which serve as source and drain electrodes, and changes in the electric current flowing through the graphene layer 15 (that is, changes in the resistance) are observed. The change in the electric current is proportional to the quantity of light absorption. By applying a gate voltage to the gate electrode 19, the carrier density of electrons or holes in the graphene layer 15 can be controlled. Graphene's physical properties including light absorption property, resistivity, and Seebeck coefficient are affected by the carrier density of graphene. The light absorption property of the photosensor device 10 is optimally controlled by the gate voltage.

An electric field is applied to the graphene layer 15 by applying a voltage between the electrodes 14a and 14b, and electron-hole pairs generated upon incidence of infrared rays onto the device flow through the graphene layer 15. This drain current can be controlled by the gate voltage. By applying a gate voltage that minimizes the drain current without light incidence in advance, the drain current to gate voltage characteristic shifts due to incidence of light. Because the drain current increases according to the intensity of the incident light, the quantity of the incident light can be detected by detecting the change in the drain current.

Using the graphene layer 15, the photosensor device 10 can operate at room temperature and detect incident light in a wide wavelength range (including visible light and infrared light). By forming periodic holes 151 in the graphene layer 15, light absorption is enhanced and sensitivity is improved. In addition, by providing the ALD layer 25, the weather resistance is enhanced and the reliability of device operation is maintained.

FIG. 3A to FIG. 3I illustrate a manufacturing process of the photosensor device 10. The steps illustrated in FIG. 3A to FIG. 3I are only examples which may be taken when manufacturing the photosensor device 100, and do not intend to limit the disclosure to the materials, parameters, or the like described below.

Figure 3A:
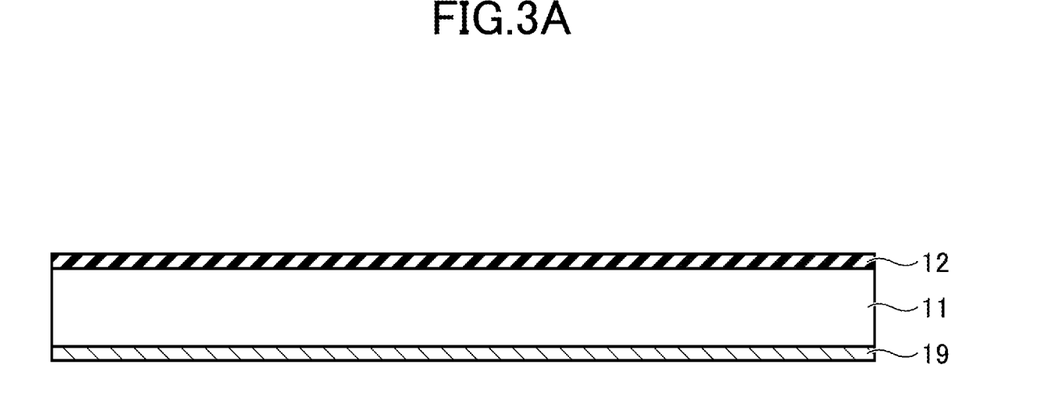
FIG. 3A illustrates a manufacturing process of a photosensor device according to an embodiment.

In FIG. 3A, a silicon substrate with a thermal oxide film is prepared. The silicon substrate may be used as the substrate 11, and the thermal oxide film may be used as the insulating film 12. A metal layer is formed by, for example, electron beam (EB) physical vapor deposition on the back surface of the substrate 11 opposite to the insulating film 12. The metal layer serves as a gate electrode 19, which may be called back gated. The metal layer may have a two-layer structure of titanium (Ti) and gold (Au).

Figure 3B:
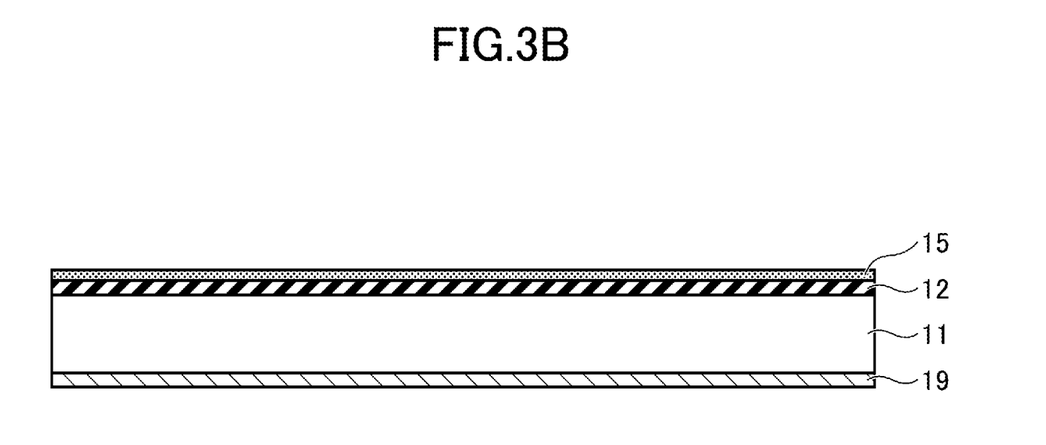
FIG. 3B illustrates a manufacturing process of the photosensor device according to the embodiment.

In FIG. 3B, the graphene layer 15 is provided on the entire surface of the insulating film 12. The graphene layer 15 may be provided onto the insulating film 12 by a mechanical peeling method, transfer method, or the like. Alternatively, a catalytic metal may be deposited on the insulating film 12 by sputtering, and graphene may be directly grown on the insulating film 12 by chemical vapor deposition (CVD). The graphene layer 15 may be a single-layer graphene or a layer having a thickness of several atomic layers. After the graphene layer 15 is provided, annealing may be carried out at a temperature of 150° C. to 200° C. in order to improve the adhesion between the insulating film 12 and graphene.

Figure 3C:
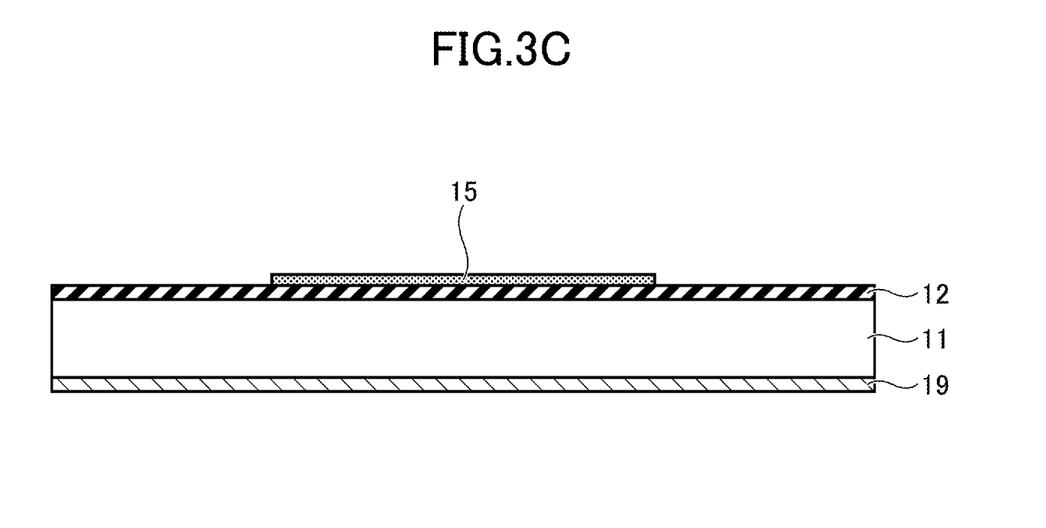
FIG. 3C illustrates a manufacturing process of the photosensor device according to the embodiment.

In FIG. 3C, the graphene layer 15 is patterned into a predetermined shape. Graphene can be micro-processed by oxygen asking, oxygen ion beam, or the like.

Figure 3D:
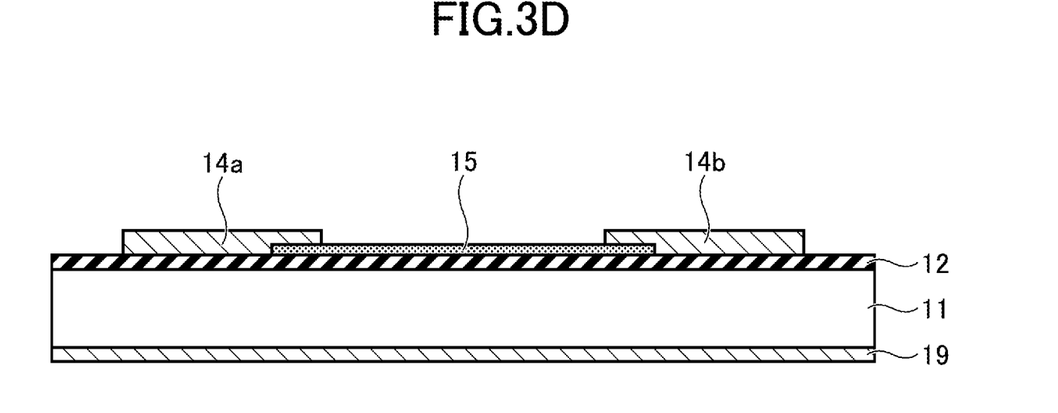
FIG. 3D illustrates a manufacturing process of the photosensor device according to the embodiment.

In FIG. 3D, a pair of electrodes 14a and 14b are formed so as to be connected to the processed graphene layer 15. The electrodes 14a and 14b are formed of a good conductor such as Au or palladium (Pd). Au has good electrical conductivity but is easily peeled off. Accordingly, a Ti or chromium (Cr) film may be formed as the underlayer of the Au film to improve the adhesion to the lower layer. In this case, it is desirable to make the thickness of the underlying metal film as thin as possible in order to keep the electrical conduction as high as possible.

Figure 3E:
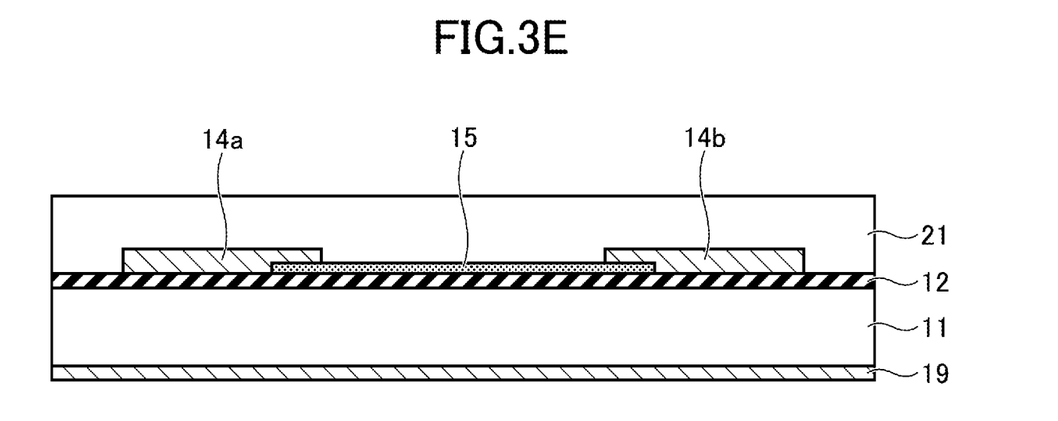
FIG. 3E illustrates a manufacturing process of the photosensor device according to the embodiment.

In FIG. 3E, the passivation layer 21 is formed on the entire surface. As the passivation layer 21, a resin having a low dielectric constant and transparent to the wavelength range of the light to be detected, which can be patterned by EB lithography, may be used. Examples of such a resin include, but are not limited to acrylic resin, polymethylmethacrylate (PMMA), hydrogen silsesquioxane (HSQ), etc. Films of two or more of these materials may be superimposed or laminated. For example, HSQ may be applied on the PMMA layer to form the passivation layer 21. The thickness of the passivation layer 21 may be 1 to several microns.

Figure 3F:
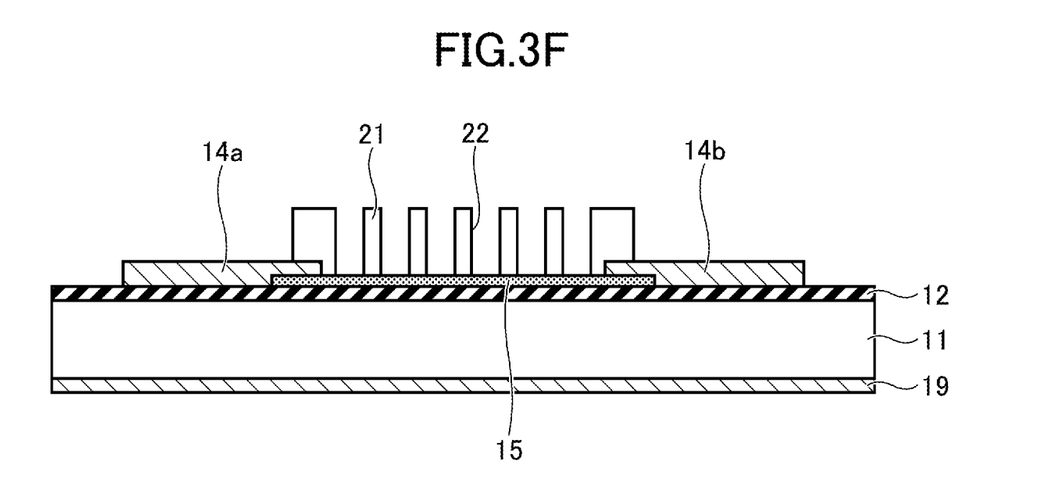
FIG. 3F illustrates a manufacturing process of the photosensor device according to the embodiment.

In FIG. 3F, the passivation layer 21 is processed into a predetermined shape. The passivation layer 21 may be processed by exposure and development. Openings 22 are then formed in the processed passivation layer 21 by BB lithography, such that a part of the graphene layer 15 is exposed in the openings 22. The diameter of the openings 22 may be 200 to 400 nm.

Figure 3G:
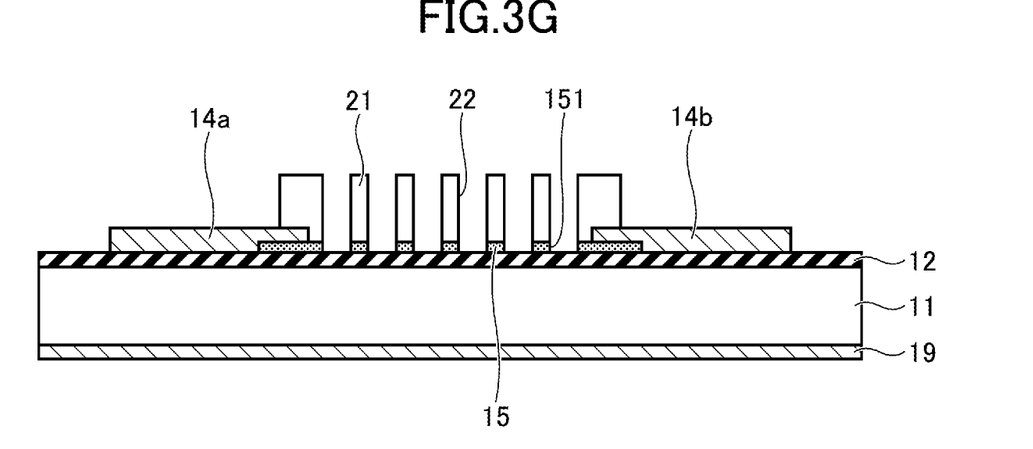
FIG. 3G illustrates a manufacturing process of the photosensor device according to the embodiment.

In FIG. 3G, holes 151 are formed in the graphene layer 15 by ion beam etching, using the passivation layer 21 with the openings 22 as a mask. Using an ion beam shower device, ion beam irradiation of 10 seconds is repeated several times at intervals of 10 seconds. The number of times of the ion beam irradiation is determined by the thickness of graphene. By the ion beam etching, the graphene layer 15 can be selectively etched, while the other graphene area covered with the passivation layer 21 can be maintained. In general, oxygen ashing is used to remove resin. However, with oxygen ashing, the graphene layer 15 located under the passivation layer 21 is also etched. By using ion beam etching, the graphene layer 15 around the holes 151 is maintained, and the current flowing through the graphene layer 15 can be correctly detected.

Figure 3H:
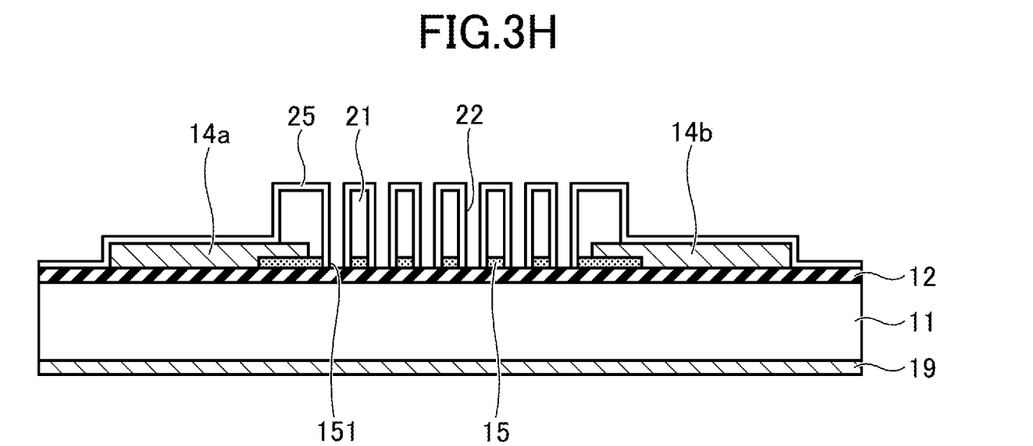
FIG. 3H illustrates a manufacturing process of the photosensor device according to the embodiment.

In FIG. 3H, the ALD layer 25 of, for example, $Al_2O_3$ is deposited on the entire surface. The deposition of the ALD layer 25 is carried out by heating in a vacuum state to remove moisture from the surface (owing to the effect of vacuum annealing). The material gases of the ALD layer 25, for example, trimethylaluminum (TMA) and water vapor, enter the openings 22. The material gases not only flow along the inner walls of the openings 22 and the side surfaces of the holes of the graphene layer 15, but also penetrate through the interface between the graphene layer 15 and the passivation layer 21. The ALD layer 25 fills gaps between the graphene layer 15 and the passivation layer 21, and continuously covers the side surfaces of the holes 151 and the inner walls of the openings 22. Accordingly, a portion of the ALD layer 25 is also present at the interface between the graphene layer 15 and the passivation layer 21. The gaps between the graphene layer 15 and the passivation layer 21 are filled with the ALD layer 25, and moisture or impurities can be prevented from entering the graphene layer 15.

Figure 3I:
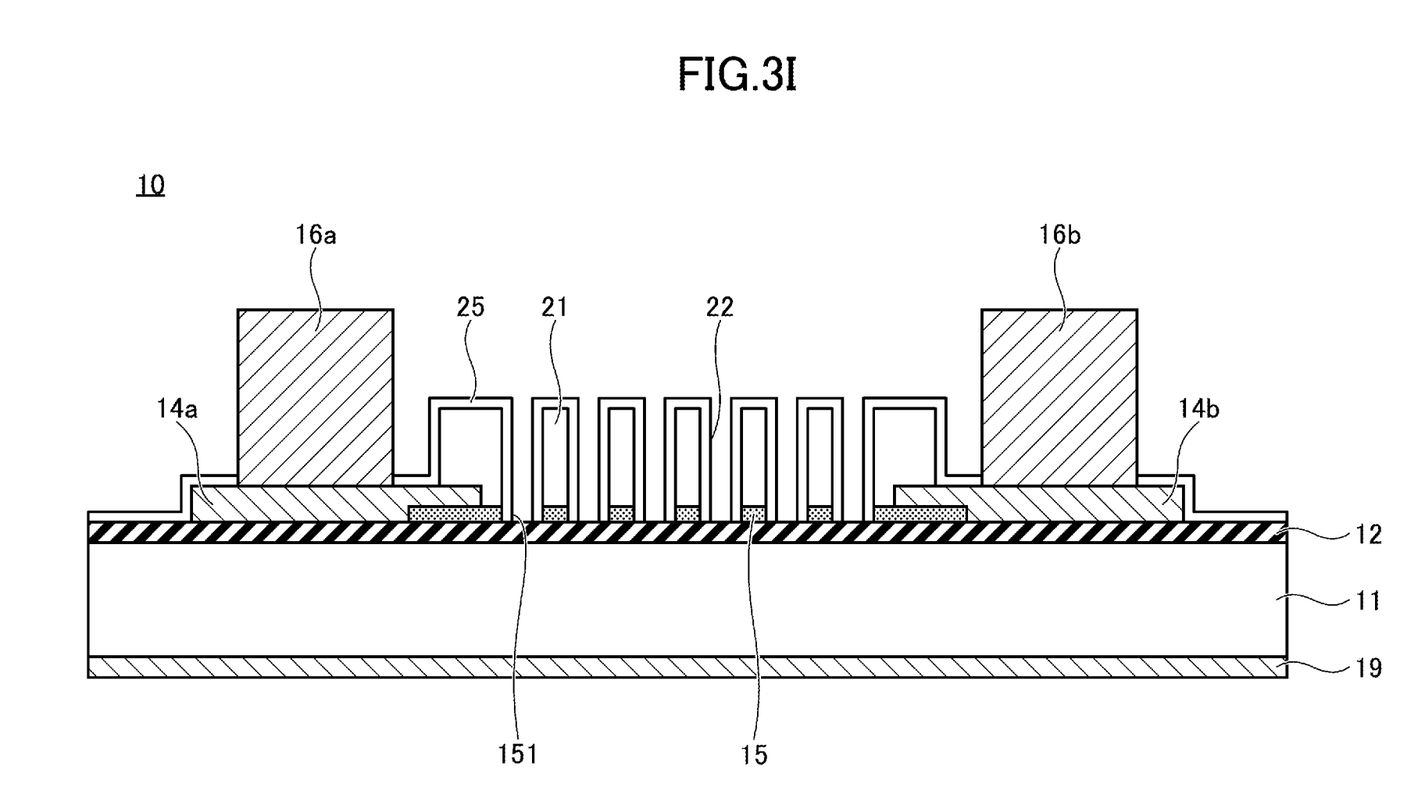
FIG. 3I illustrates a manufacturing process of the photosensor device according to the embodiment.

In FIG. 3I, contact holes are formed at predetermined positions of the ALD layer 25 to form electrode pads 16a and 16b connected to the electrodes 14a and 14b, respectively, whereby the photosensor device 10 is obtained.

Figure 4:
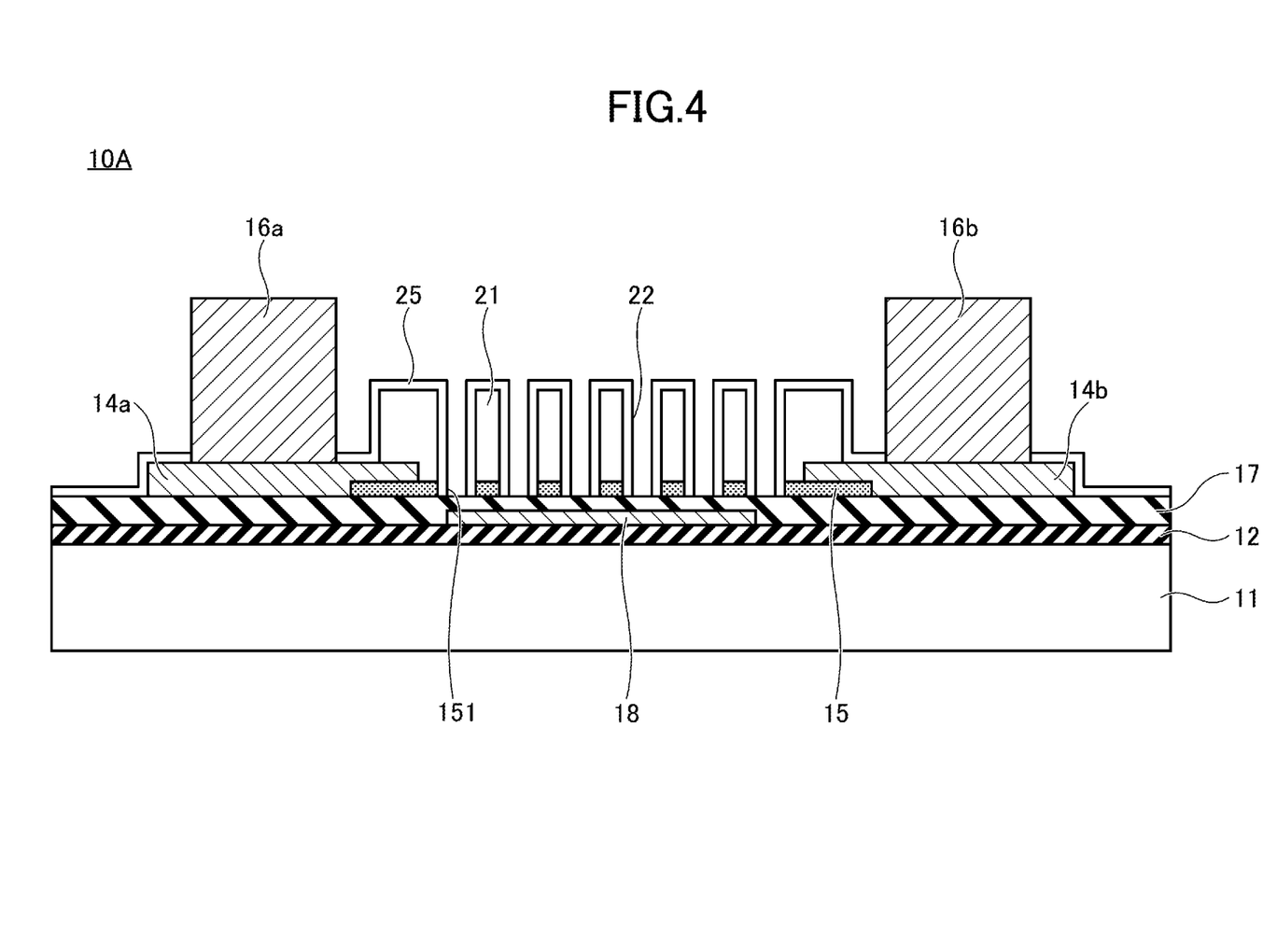
FIG. 4 is a modified example of the photosensor device.

FIG. 4 illustrates a photo sensor device 10A as a modification example. The photosensor device 10A has an embedded gate electrode 18, in place of the back gate. The gate electrode 18 may be provided on the insulating film 12 making use of the thermal oxide film, and another insulating film 17 is provided so as to cover the gate electrode 18. The graphene layer 15 is provided on the insulating film 17. The insulating film 17 under the graphene layer 15 serves as a gate insulating film. By applying a gate voltage to the graphene layer 15 via the insulating film 17, the carrier density of electrons or holes in the graphene layer 15 is controlled.

The photosensor device 10A also has an array of periodically arranged holes 151 in the graphene layer 15, and has an ALD layer 36 continuously covering the edges and side surfaces of the holes 151, as well as the inner walls of the openings 22 of the passivation layer 21. The sensitivity and weather resistance of the photosensor device 10A are improved, and the reliability of operation can be maintained.

Figure 5:
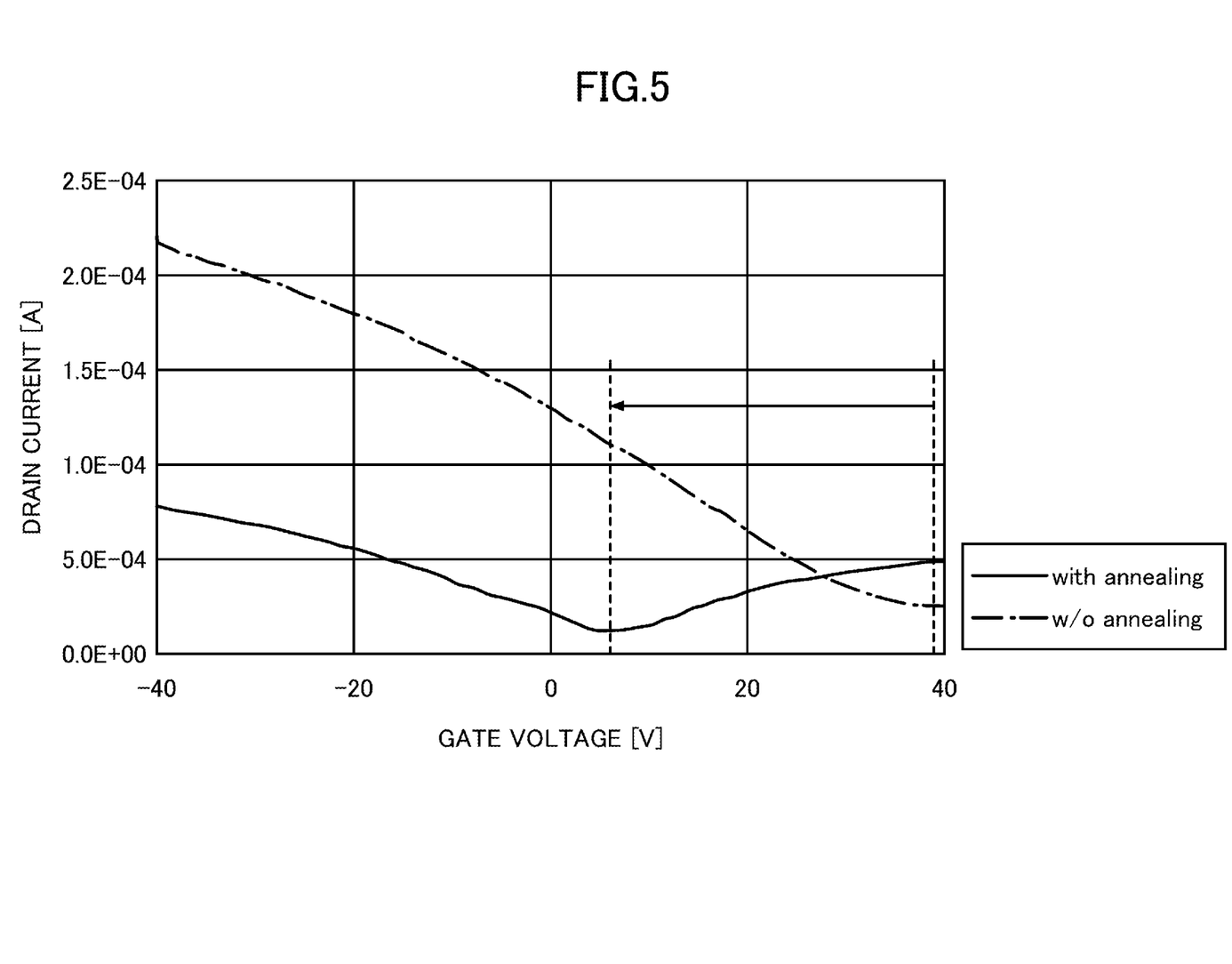
FIG. 5 illustrates the necessity of improving weather resistance.

FIG. 5 is a diagram illustrating the necessity of improving weather resistance. The horizontal axis of FIG. 5 indicates gate voltage [V], and the vertical axis indicates drain current [A]. The solid line represents the electrical characteristic of a sample to which vacuum annealing is applied, and the dashed-dotted line represents the electrical characteristic of a sample without annealing.

As has been described above, the electrical characteristics of the photosensor device may change due to the environmental changes. The moisture level or the amount of moisture on the device surface changes depending on the presence or absence of annealing. Changes in the amount of water on the device surface can be regarded as changes in the environment. The Dirac point shifts according to the environmental changes. The Dirac point is the gate voltage at which the drain current is minimized without incidence of light. Ideally, the Dirac point is located at 0 V of the gate voltage.

Two types of samples of the photosensor device, both not having the ALD layer 25, are prepared for measurement. One is a sample on which vacuum annealing is performed at 150° C. for 1 hour, and the other is a sample without annealing. Each of the samples is provided with Au/Cr electrodes 14a and 14b. The distance between the electrodes is 4.07 μm. The widths of the electrodes 14a and 14b (along the vertical direction of FIG. 1) are 8.24 μm, the width of the graphene layer 15 (along the vertical direction of FIG. 1) is 5 μm, and the length (along the horizontal direction of FIG. 1) is 20 μm. Holes with an average diameter of 200 nm are formed in the graphene layer 15. Without incidence of light, the gate voltage is changed from −40V to +40 V, and the induced drain current is measured. The vacuum-annealed sample is cooled without being taken out of the chamber, and measurement is conducted in vacuum.

With the sample without annealing, the Dirac point is in the vicinity of 40 V due to the influence of moisture on the device surface, and the drain current changes significantly over the entire range of the measurement. This indicates the sensor characteristics in a humid environment. In contrast, the Dirac point of the sample subjected to the vacuum annealing is near 0 V, and the change in the drain current is not so significant even if the absolute value of the gate voltage is increased. This indicates the sensor characteristics in an environment with less influence of moisture.

It is desirable for a sensor device that the electrical characteristic of the solid line is maintained in spite of the environmental change. In the photosensor devices 10 and 10A, penetration of moisture is prevented by the ADD layer 25, and the Dirac point is suppressed from shifting. The ADD layer 25 can reproduce the electrical characteristics of the annealed sample.

Figure 6:
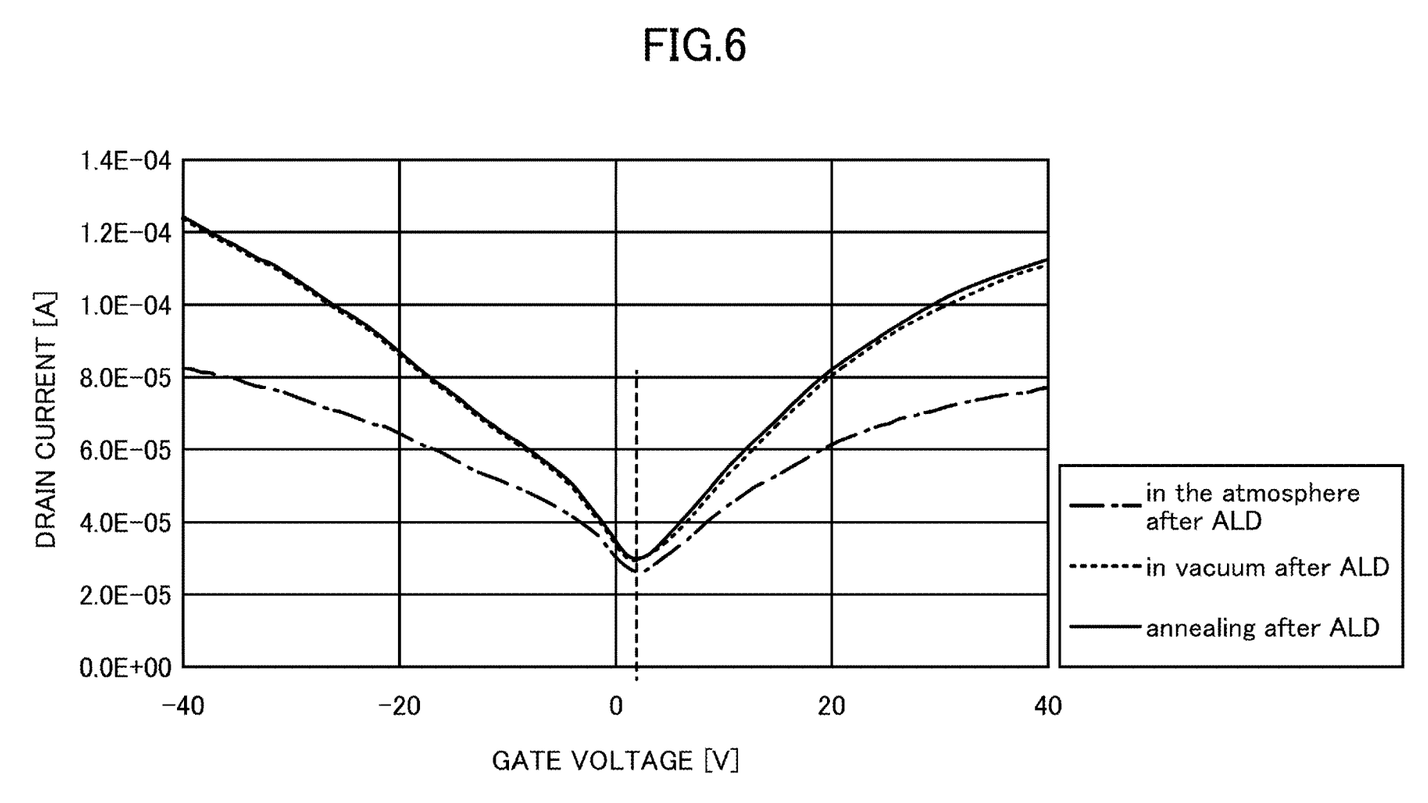
FIG. 6 illustrates the effect of the atomic layer deposition (ALD) layer.

FIG. 6 illustrates the effect of the ALD layer 25. The solid line represents the electrical characteristic of the sample annealed after ALD, the broken line represents the electrical characteristic measured in vacuum without post-ALD annealing, and the dashed-dotted line represents the electrical characteristic measured in the atmosphere without post-ALD annealing. The measurement in vacuum represents the environment at room temperature.

Regardless of the presence or absence of annealing, the Dirac point, that is, the point at which the drain current is minimized without incidence of light, is almost constant, located near the gate voltage of 0 V. This is the advantageous effect of the ALD layer 25. By providing the ALD layer 25, subsequent annealing is unnecessary because the fluctuation of the Dirac point is suppressed even without annealing.

At the Dirac point, the change in the drain current induced by incidence of light is significant. By applying a bias voltage between the source and drain electrodes, the current change can be read at high sensitivity.

Figure 7:
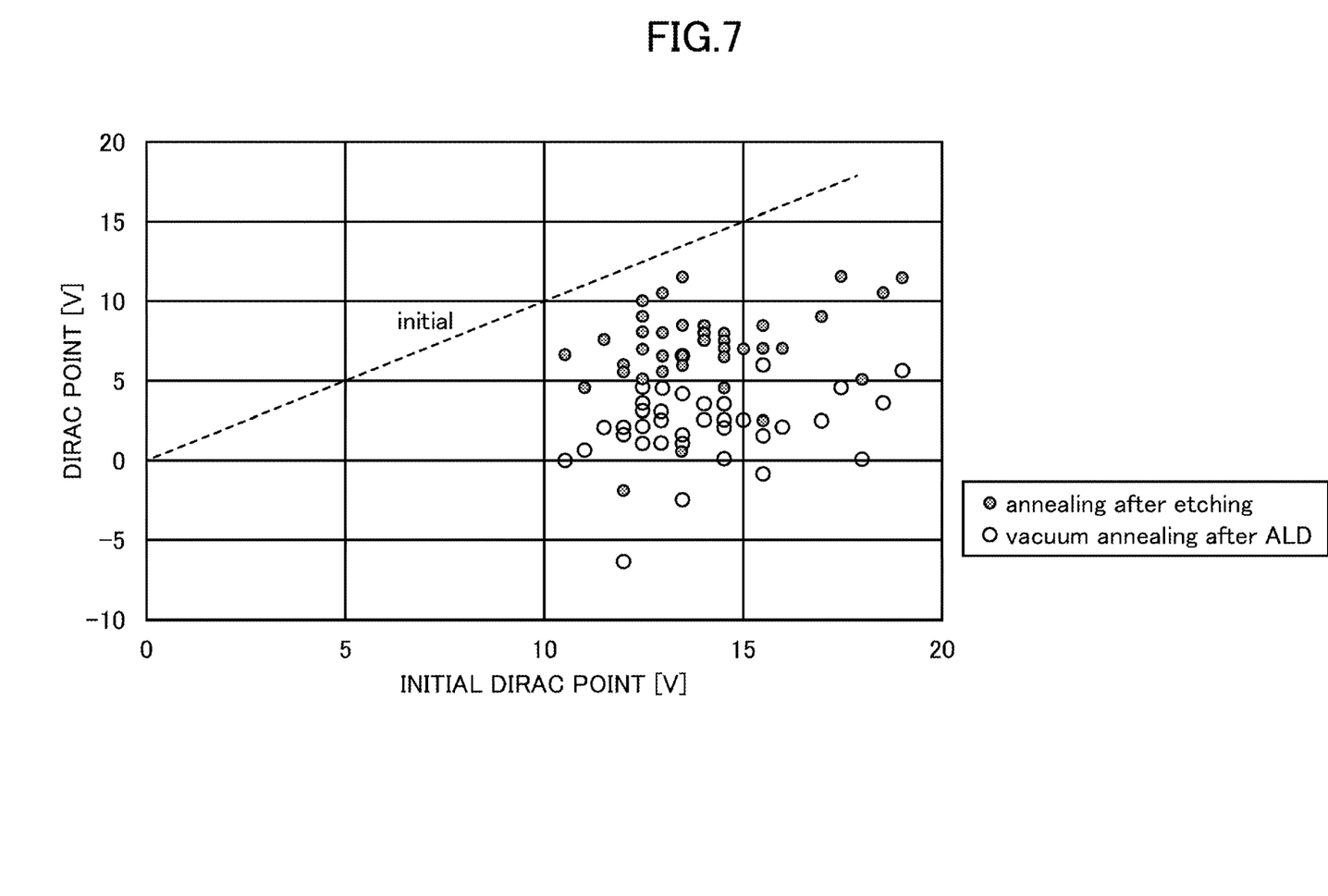
FIG. 7 illustrates the effect of the atomic layer deposition (ALD) layer.

FIG. 7 is another diagram illustrating the effect of the ALD layer 25. The horizontal axis indicates the initial Dirac point, and the vertical axis indicates the measured value of the Dirac point. The dashed line extending straight in the figure shows the characteristic of the initial Dirac point. The initial Dirac point resides in 10 V to 19 V. If the measurement value is located on the dashed line, it means that there is no effect of ALD. If the measurement value is below the dashed line, the Dirac point becomes smaller and it is approaching 0 V.

The gray circles represent the measurements of the Dirac point for those samples subjected to vacuum-annealing after the holes 151 are formed in the graphene layer 15 by ion beam etching. The white circles represent the measurements of the Dirac point for the samples subjected to vacuum-annealing after the ALD layer 25 is formed. By annealing the graphene layer 15 after the ion beam etching for forming the holes 151, the Dirac point can be lowered from the initial Dirac point. With the samples annealed after the formation of the ALD layer 25, the Dirac point further approaches 0 V. It is understood from the foregoing that the ALD layer 25 has the effect of reducing the Dirac point to bring it to be closer to 0 V.

Figure 8:
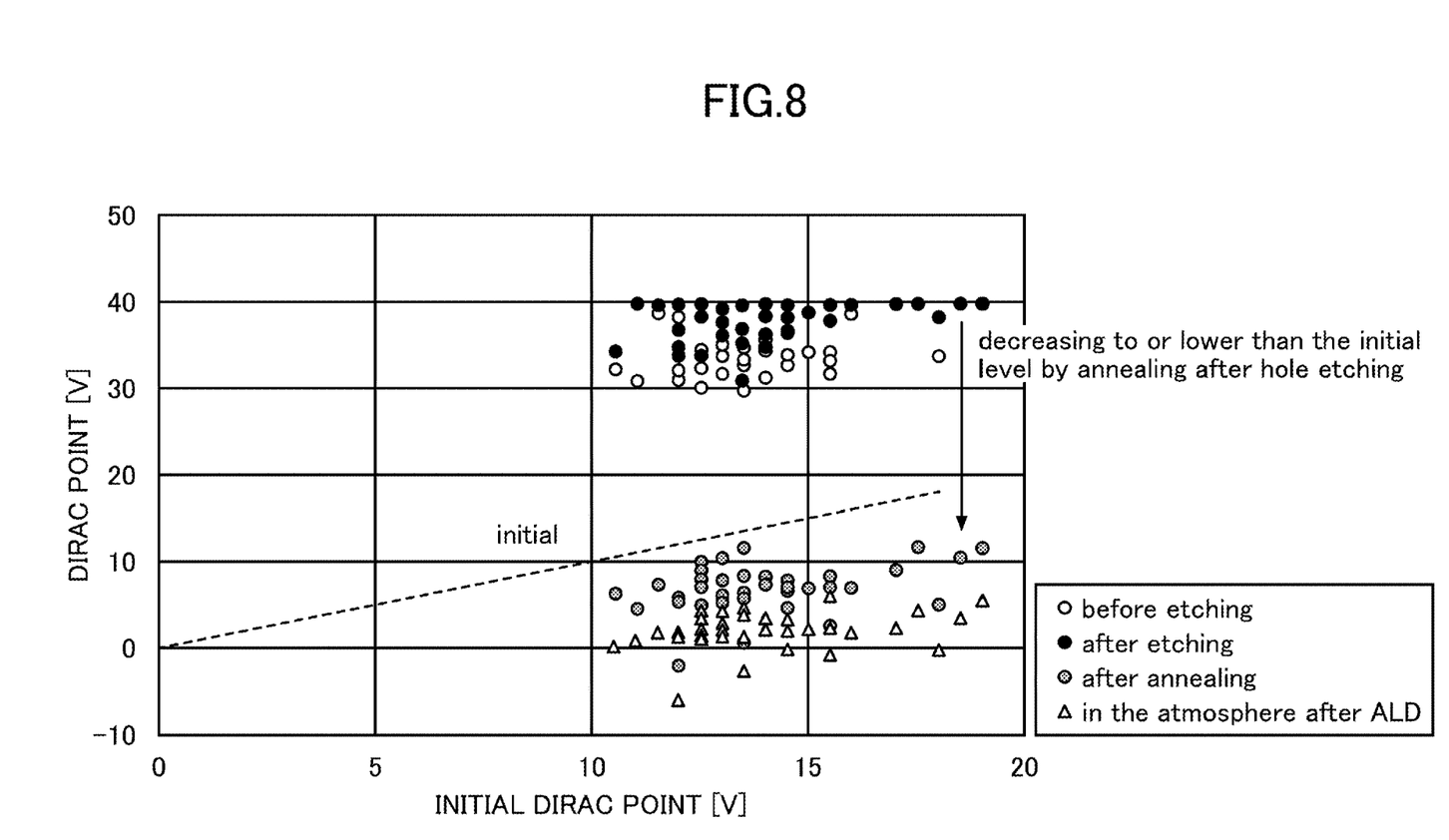
FIG. 8 illustrates the effect of the atomic layer deposition (ALD) layer.

FIG. 8 is yet another diagram illustrating the effect of the ALD layer 25. Similar to FIG. 7, the horizontal axis indicates the initial Dirac point, and the vertical axis indicates the measured values of the Dirac point. White circles represent the measurements of the Dirac point before the holes 151 are formed in the graphene layer 15. Black circles represent the measurements of the Dirac points after the holes 151 are formed in the graphene layer 15. In either case, annealing is not carried out. The measurements of the Dirac point for the samples having been subjected to ion beam etching are distributed near 40 V, which is consistent with the characteristic of the sample without annealing in FIG. 5. Even with the samples before the ion beam etching, the Dirac point is in the vicinity of 35 V.

The gray circles represent the measurements of the Dirac point for the samples having been subjected to annealing after the etching of the graphene layer 15. White triangles represent the measurements of the Dirac point for the samples with the ALD layer 25 formed after the etching of the graphene layer 15 without annealing, and measured in the air. By annealing, the Dirac point can be reduced to 10 V or less. This measurement result is consistent with the characteristic of the sample with annealing in FIG. 5.

By providing the ALD layer 25, the Dirac point can be further reduced, and brought closer to 0 V, without performing a separate annealing process. By forming the ALD layer 25, a same or even greater effect than the case where vacuum annealing is performed after the holes 151 are formed in the graphene layer 15, is achieved. In other words, even if annealing is not performed after the holes 151s are formed in the graphene layer 15, the annealing effect can be imparted during the ALD process for forming the ALD layer 25. Thus, penetration of moisture or impurities into the graphene can be prevented, and the Dirac point can be reduced to near around 0 V.

In terms of process, it is easier and takes less time to form the ALD layer 25 than to perform an annealing process. Further, the fact that the Dirac point is in the vicinity of 0 V means that the initial gate voltage, which is determined in the state without incidence of light, can be set in the vicinity of 0 V, and that the power consumption can be reduced. As has been described above with reference to FIG. 6, by providing the ALD layer 25, the fluctuation of the Dirac point due to environmental changes can be suppressed, and the photosensor device 10 or 10A having satisfactory weather resistance is achieved.

Although the present disclosure has been described above based on a specific example, the present disclosure is not limited to the above-mentioned example. The shape (including width and length) and number of layers of the graphene layer 15 can be appropriately designed. The holes 151 formed in the graphene layer 15 are not limited to circular holes, and may be polygonal or elliptical holes. The arrangement of the holes 151 is not limited to the matrix-like arrangement as shown in FIG. 1, and may be a staggered arrangement or a fine arrangement. The ALD layer 25 is not limited to $Al_2O_3$, and a thin film of a metal oxide such as $HfO_2$ or $SiO_2$ or a thin film of a metal nitride such as $TaN_x$ or $SiN_x$ may be formed by plasma ALD.

Although the photosensor device has been described above based on particular examples, the present invention is not limited to the above-described specific embodiments. The shape (including the width and the length) and the number of layers of the graphene layer 15 can be appropriately designed. The holes 151 formed in the graphene layer 15 are not limited to circular holes, and they may be polygonal or elliptical holes. The layout pattern of the holes 151 is not limited to the matrix pattern illustrated in FIG. 1, and a staggered or alternate pattern, or a close-packed arrangement may be employed. The material of the ALD layer 25 is not limited to $Al_2O_3$, and a metal oxide such as $HfO_2$ or $SiO_2$, or a metal nitride such as $TaN_x$ or $SiN_x$ may be used to formed the thin film by plasma ALD.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the scope of the invention.

What is claimed is:

1. A photosensor device comprising:
a substrate;
a graphene layer provided on the substrate;
a pair of electrodes electrically connected to the graphene layer; and
a passivation layer formed of a resin and configured to cover the graphene layer,
wherein the graphene layer has holes which are periodically arranged, and the passivation layer is provided with openings that communicate with the holes, side surfaces of the holes and inner walls of the openings being continuously covered with an insulating thin film.

2. The photosensor device as claimed in claim 1, wherein the passivation layer is transparent to a target range of wavelength and is made of a resin material which can be patterned by electron beam lithography.

3. The photosensor device as claimed in claim 1, wherein a portion of the insulating thin film is provided at an interface between the graphene layer and the passivation layer.

4. The photosensor device as claimed in claim 1, further comprising:
a gate electrode provided onto the substrate; and
an insulating film provided between the graphene layer and the gate electrode.

5. A method of manufacturing a photosensor device, comprising:
forming a graphene layer on an insulating film on a substrate;
forming a pair of electrodes electrically connected to the graphene layer;
forming a passivation layer of a resin, covering the graphene layer;
forming openings in the passivation layer, the openings being periodically arranged;
forming holes in the graphene layer, using the passivation layer with the openings as a mask, the holes being periodically arranged; and
forming an insulating thin film over an entire surface of the substrate having the openings and the holes.

6. The method as claimed in claim 5, wherein the openings are formed by electron beam lithography.

7. The method as claimed in claim 5, wherein the holes are formed by ion beam etching.

8. The method as claimed in claim 5, further comprising:
forming a gate electrode onto the substrate.

* * * * *